(12) United States Patent
Chen et al.

(10) Patent No.: US 8,395,239 B2
(45) Date of Patent: Mar. 12, 2013

(54) GROUNDED SEAL RING STRUCTURE IN SEMICONDUCTOR DEVICES

(75) Inventors: Hsien-Wei Chen, Sinying (TW); Chung-Ying Yang, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 328 days.

(21) Appl. No.: 12/915,170

(22) Filed: Oct. 29, 2010

(65) Prior Publication Data

US 2012/0104594 A1    May 3, 2012

(51) Int. Cl.
*H01L 29/06* (2006.01)
*H01L 21/00* (2006.01)

(52) U.S. Cl. ........ 257/619; 257/620; 257/737; 438/106; 438/113

(58) Field of Classification Search .................. 257/619, 257/620, 737; 438/106, 113
See application file for complete search history.

(56) References Cited

U.S. PATENT DOCUMENTS

| | | | |
|---|---|---|---|
| 6,492,716 B1 | 12/2002 | Bothra et al. | |
| 6,537,849 B1 | 3/2003 | Tsai et al. | |
| 2006/0244133 A1* | 11/2006 | Chen et al. | 257/728 |
| 2007/0023920 A1* | 2/2007 | Jao et al. | 257/778 |
| 2008/0191205 A1* | 8/2008 | Tsai et al. | 257/48 |

* cited by examiner

*Primary Examiner* — Long Tran
(74) *Attorney, Agent, or Firm* — Haynes and Boone, LLP

(57) ABSTRACT

A semiconductor device includes a substrate having a seal ring region and a circuit region, at least one corner bump disposed in the circuit region, a seal ring structure disposed in the seal ring region, and a connector electrically coupling a metal layer of the seal ring structure to the at least one corner bump. The at least one corner bump is configured to be coupled to a signal ground. A method of fabricating a semiconductor device includes providing a substrate having a seal ring region and a circuit region, providing at least one corner bump in a triangular corner bump zone in the circuit region, providing a seal ring structure in the seal ring region, electrically coupling a metal layer of the seal ring structure to the at least one corner bump, and electrically coupling the at least one corner bump to a signal ground.

19 Claims, 5 Drawing Sheets

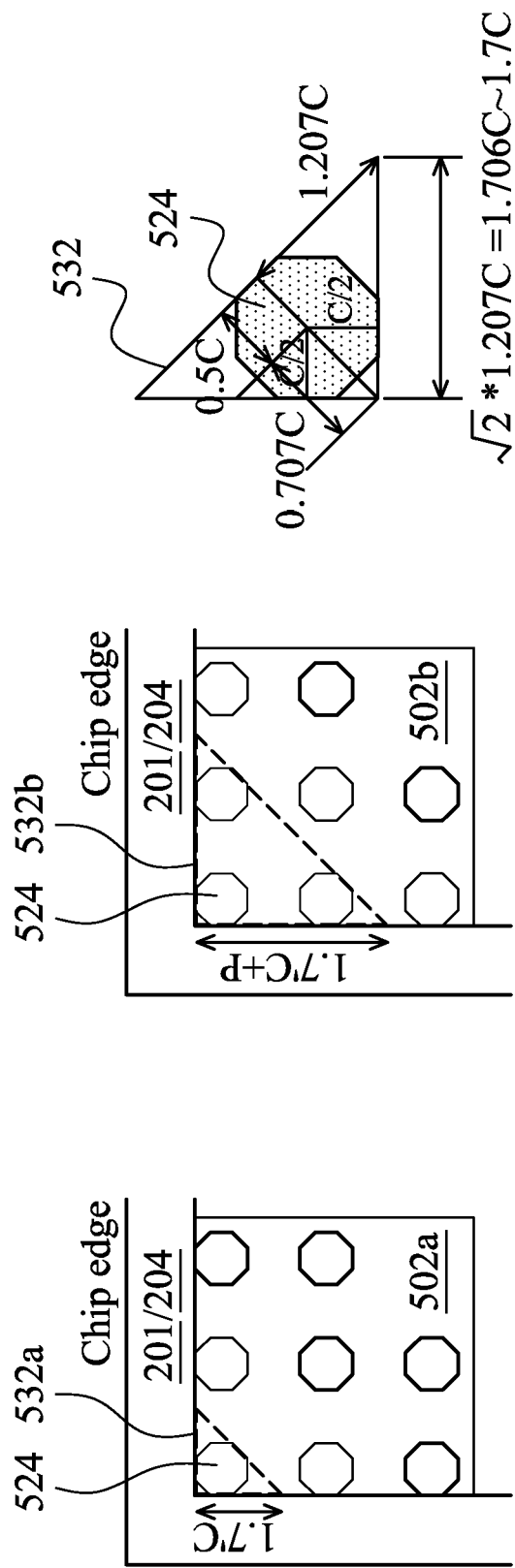

U.S. 8,395,239 B2

GROUNDED SEAL RING STRUCTURE IN SEMICONDUCTOR DEVICES

BACKGROUND

In the design and packaging of semiconductor integrated circuits (ICs), there are several areas of concern. Moisture needs to be prevented from entering the circuits because: (1) moisture can be trapped in oxides and increase the dielectric constant thereof; (2) moisture can create trapped charge centers in gate oxides causing threshold voltage shifts in complementary metal-oxide-semiconductor (CMOS) transistors; (3) moisture can create interface states at the Si-gate oxide interface causing degradation in the transistor lifetime through increased hot-electron susceptibility; (4) moisture can cause corrosion of the metal interconnect, reducing the reliability of the IC; and (5) when trapped in Si-oxide, moisture can reduce the oxide mechanical strength and the oxide may become more prone to cracking due to tensile stress. Ionic contaminants can also cause damage to the IC as they can diffuse rapidly in silicon oxide. For instance, ionic contaminants can cause threshold voltage instability in CMOS transistors and alter the surface potential of the Si surface in the vicinity of the ionic contaminants. Dicing processes that separate adjacent IC dies from one another may also cause potential damage to the IC.

A seal ring has been used in the industry to protect the IC from moisture degradation, ionic contamination, and dicing processes, but improvement has been desirable. In particular, the seal ring may cause signal interference if not properly grounded. Furthermore, design rules and circuit area issues must be taken into consideration when coupling the seal ring to a ground. Accordingly, improved methods of semiconductor device fabrication and devices fabricated by such methods are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5B are top plan views of different triangular corner bump zones of an IC chip according to various aspects of the present disclosure, and FIG. 5C illustrates an embodiment of a corner bump according to an aspect of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
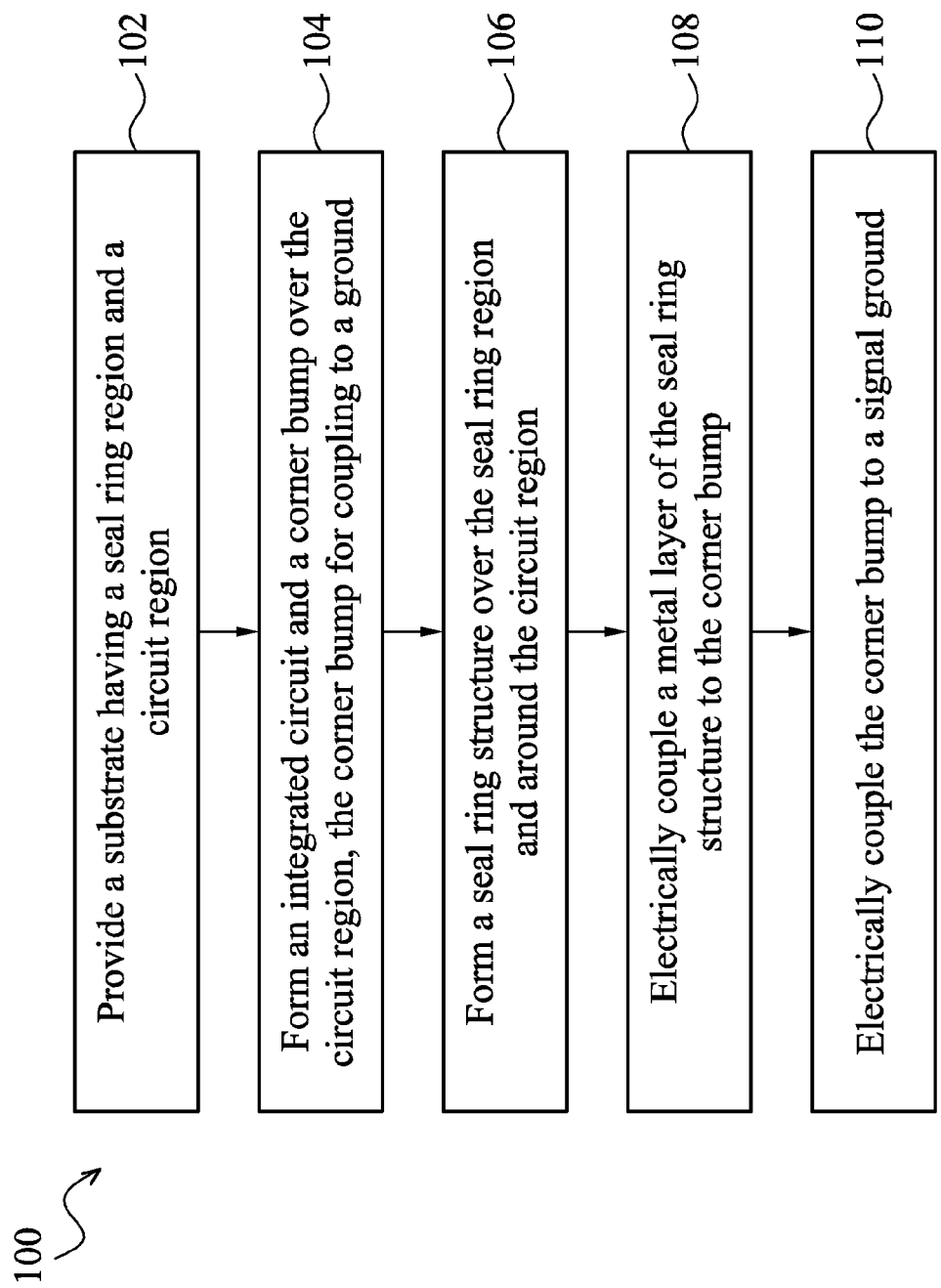
FIG. 1 is a flowchart illustrating a method for fabricating a semiconductor device with a seal ring structure electrically coupled to a corner bump according to various aspects of the present disclosure.
Figure 2:
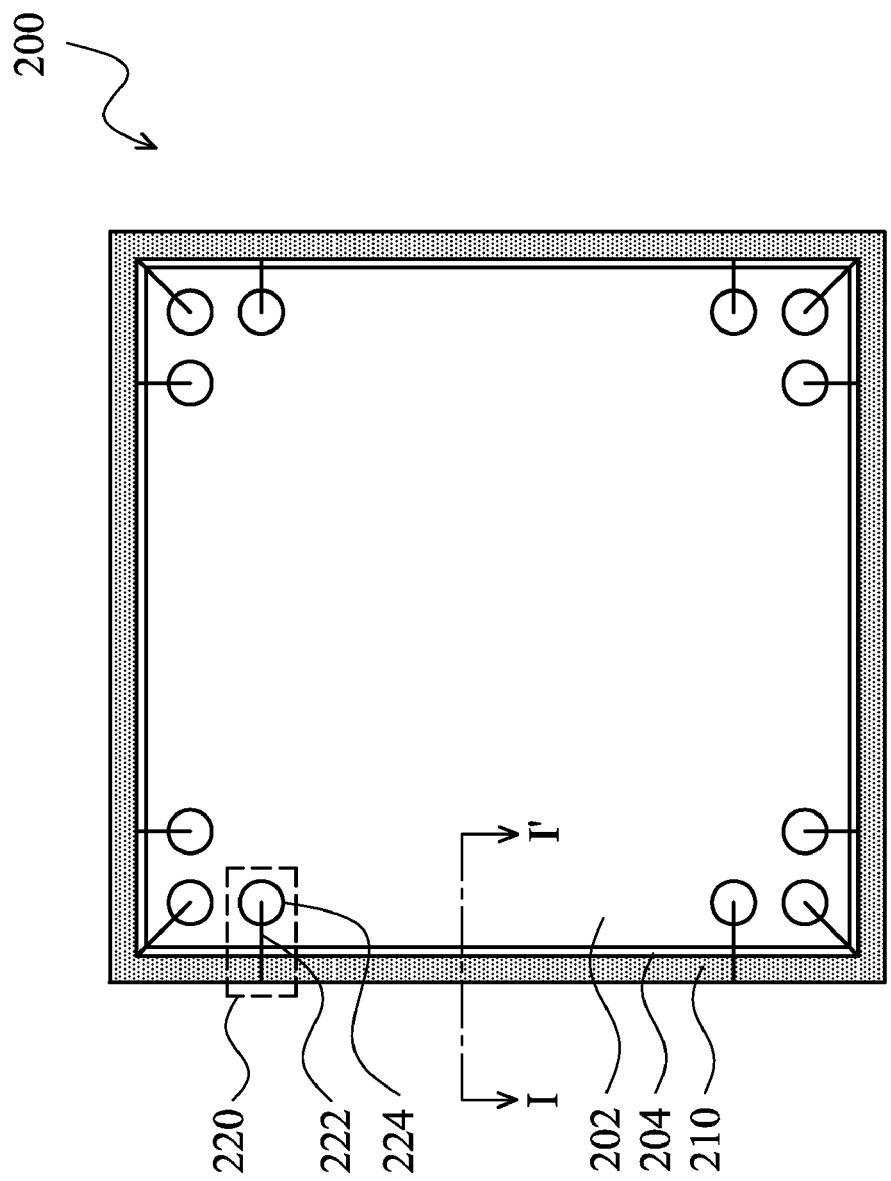
FIG. 2 is a top plan view of an integrated circuit (IC) die with a grounded seal ring structure according to various aspects of the present disclosure.
Figure 3:
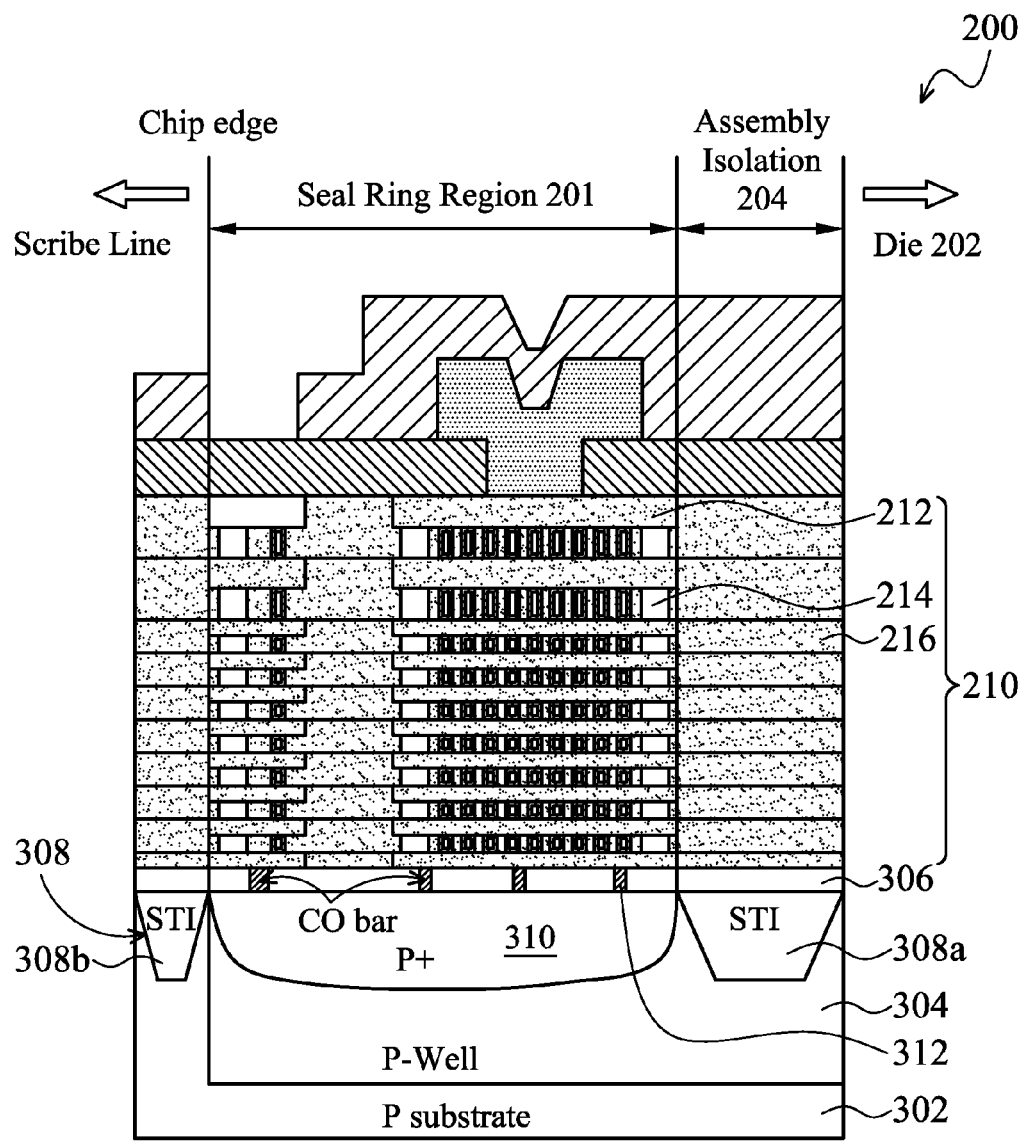
FIG. 3 is a cross-sectional view along line I-I' in FIG. 2 of a seal ring section according to various aspects of the present disclosure.
Figure 4:
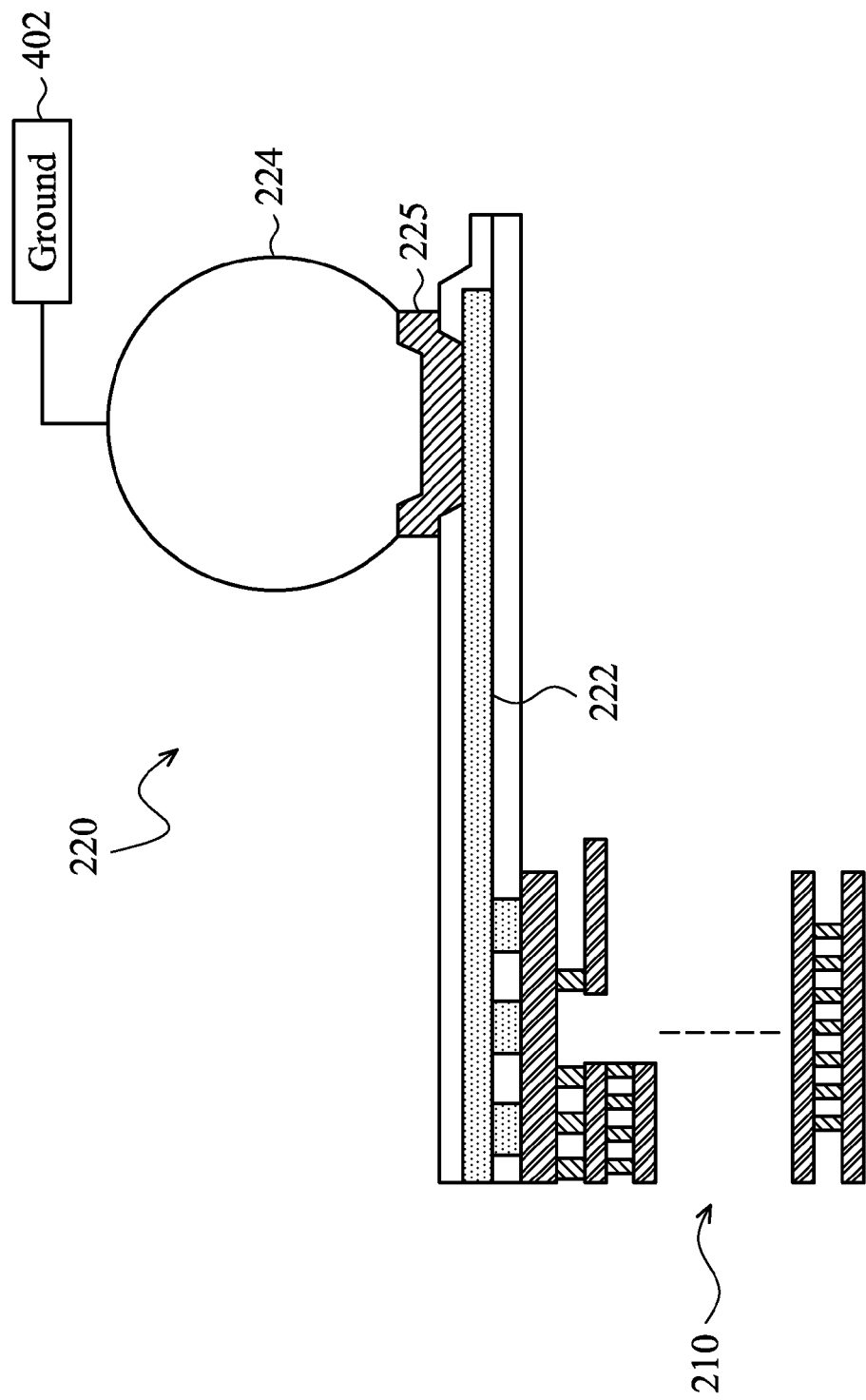
FIG. 4 is a cross-sectional view of an embodiment of the seal ring structure electrically coupled to a corner bump according to various aspects of the present disclosure.

Referring to the figures, FIG. 1 illustrates a flowchart of a method 100 for fabricating a semiconductor device with a seal ring structure electrically coupled to a corner bump for electrically coupling the seal ring structure to a ground according to various aspects of the present disclosure. FIG. 2 is a top plan view of a device 200 including an integrated circuit (IC) die 202, a seal ring structure 210 around the IC die 202, and an assembly isolation region 204 therebetween according to various aspects of the present disclosure. FIG. 3 is a cross-sectional view of an embodiment of the seal ring structure 210 according to various aspects of the present disclosure. FIG. 4 is a cross-sectional view of an embodiment of the seal ring structure 210 electrically coupled to a corner bump 224 according to various aspects of the present disclosure. FIGS. 5A and 5B are top plan views of different triangular corner bump zones 532 of an IC chip according to various aspects of the present disclosure, and FIG. 5C illustrates an embodiment of a corner bump 524 according to an aspect of the present disclosure.

It is noted that similar features may be similarly numbered for the sake of simplicity and clarity. It is further noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a replacement poly gate process (RPG)). In a gate last process, a dummy gate structure (e.g., formed of polysilicon (or poly)) may be initially formed in both a region for a seal ring and a region for a circuit, and may be followed by a normal CMOS process flow until deposition of an interlayer dielectric (ILD). The dummy poly gate structure in the circuit region may then be removed and replaced with a high-k gate dielectric/metal gate structure.

Referring now to FIG. 1, method 100 begins with block 102 in which a semiconductor substrate is provided having a seal ring region and a circuit region. In an embodiment, the seal ring region is formed around the circuit region, and the seal ring region is for forming a seal ring structure thereon and the circuit region is for at least forming a transistor device therein. The method 100 continues with block 104 in which a corner bump is formed over the circuit region, and with block 106 in which a seal ring structure is formed over the seal ring region and around the circuit region. The method 100 continues with block 108 in which a metal layer of the seal ring structure is electrically coupled to the corner bump formed over the circuit region, and with block 110 in which the corner bump is electrically coupled to a signal ground. Advantageously, because the seal ring structure is grounded via the corner bump or a plurality of corner bumps, area penalty and additional cost are avoided while grounding the seal ring structure.

Referring now to FIG. 2, IC die 202 includes a plurality of corner bumps 224 which are electrically coupled to seal ring structure 210 by a plurality of metal connectors 222. A cross-sectional view of the seal ring region and the assembly isolation region along line I-I' is illustrated in FIG. 3, and a cross-sectional view of a corner bump coupled to the seal ring structure by a metal connector in a device portion 220 is illustrated in FIG. 4.

Referring now to FIG. 3 in conjunction with FIG. 2, a cross-sectional view of an embodiment of semiconductor device 200 at a stage of fabrication according to the method 100 of FIG. 1 is illustrated. The semiconductor device 200 may include a semiconductor substrate 302 such as a silicon substrate (e.g., a p-doped substrate) having a seal ring region 201 and assembly isolation region 204 surrounding IC die 202. In an embodiment, the seal ring region 201 is formed around the circuit region, and the seal ring region is for forming a seal ring structure thereon and the circuit region is for forming at least a transistor device therein. The substrate 302 may alternatively include silicon germanium, gallium arsenic, or other suitable semiconductor materials. The substrate 302 may further include doped regions, such as a P-well 304, an N-well, and/or a doped active region 310, which in this case is a P+ doped active region. In one aspect, the doped active regions may be disposed within other regions, such as P+ doped active region 310 which is at least partially or completely disposed within P-well 304. The substrate 302 may also further include other features such as a buried layer, and/or an epitaxy layer. Furthermore, the substrate 302 may be a semiconductor on insulator such as silicon on insulator (SOI). In other embodiments, the semiconductor substrate 302 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate 302 may further include underlying layers, devices, junctions, and other features (not shown) formed during prior process steps or which may be formed during subsequent process steps.

The device 200 further includes isolation structures 308, such as shallow trench isolation (STI) features 308a and 308b, or LOCOS features formed in the substrate 302 for isolating active regions 310 from other regions of the substrate 302. The active regions 310 may be configured as an NMOS device (e.g., nFET) or as a PMOS device (e.g., pFET) in one example.

The device 200 further includes an interlayer 306 deposited over the substrate including STI features 308a, 308b and active region 310. In one example, interlayer 306 may be deposited by a high aspect ratio process (HARP) and/or a high density plasma (HDP) CVD process. In one example, interlayer 306 includes a dielectric and is an oxide.

The device 200 further includes contact bars 312 formed within interlayer 306 to electrically couple active region 310 to subsequently formed seal ring structure 210. It is noted that other layers may be provided in the seal ring region to form various features over the seal ring structure such as passivation layers, nitride layers, and polyimide layers deposited by CVD, spin-on techniques, and the like.

The device 200 may further include dummy gate and/or gate structures (not shown) overlying the substrate 302, which may be formed from various material layers and by various etching/patterning techniques over various regions of device 200. In one example, the semiconductor device 200 may include a dummy insulator layer (not shown) formed over the substrate. In the alternative, an insulator layer including an interfacial layer, a high k dielectric layer and/or a barrier layer may be formed on the substrate 302 and left in the final device. The insulator layer may be a dummy dielectric layer formed on the substrate 302. The dummy dielectric layer may include an oxide (e.g., thermal or chemical oxide formation) in one example. The semiconductor device 200 may further include a dummy layer formed over the substrate by a suitable deposition process. In one example, dummy gates may be comprised of polysilicon, and for this case of dummy poly gates, silane ($SiH_4$), di-silane ($Si_2H_6$), or di-clorsilane ($SiCl_2H_4$) may be used as a chemical gas in a CVD process to form the poly dummy layer. Subsequently, using conventional photolithography, patterning, and etching techniques, the dummy layer may be patterned and etched to form a plurality of dummy gates (e.g., over the seal ring region and/or the circuit region).

In one example, a photoresist (PR) layer and/or a hard mask layer (not shown) may be formed over the substrate 302 and the dummy layer (e.g., comprised of polysilicon). The hard mask layer may include silicon oxide, silicon nitride, silicon oxynitride, silicon carbide, and/or other suitable dielectric materials, and may be formed using a method such as CVD or PVD. Additionally, an antireflective coating layer or bottom antireflective coating (BARC) layer (not shown) may be used to enhance a photolithography process for patterning a photoresist layer. For example, the patterned photoresist layer may be formed on the hard mask layer including gate patterns. The gate patterns may then be used to pattern the hard mask layer by a dry etch or wet etch process. The patterned hard mask may then be used to form the gate structures by a dry etch, wet etch, or combination dry and wet etch process. Accordingly, the gate structure may include an insulator layer (not shown) and the dummy gate. The patterned PR layer may be formed by photolithography, immersion lithography, ion-beam writing, or other suitable techniques. For example, the photolithography process may include spin-coating, soft-baking, exposure, post-baking, developing, rinsing, drying, and other suitable process.

Alternatively, in a reverse dummy process, dummy gates may be comprised of dielectric gate structures instead of poly gate structures and interlayer 306 in certain regions of the device may then be comprised of poly instead of a dielectric.

Subsequently, a CMP process may be performed on the interlayer 306 (an ILD or alternatively a poly layer) to planarize the interlayer 306. After planarization of interlayer 306, device 200 may undergo additional processing (e.g., CMOS processing) to further include seal ring structure 210 formed over the seal ring region 201, a high-k gate dielectric/metal gate structure in the circuit region after dummy poly gate structures in the circuit region are removed in a gate last or RPG process, and various other features.

An example of a gate last or RPG process may include forming a PR layer in the seal ring region to protect dummy gates in the seal ring region, and then removing the dummy gates in the circuit region by a dry etching, wet etching, or combination dry and wet etching process to thereby form trenches. For example, a wet etching process may include exposure to a hydroxide containing solution (e.g., ammonium hydroxide), de-ionized water, and/or other suitable etchant solutions. The dummy poly gate (and/or dummy dielectrics) in the circuit region may be removed in a single-step etching process or multiple-step etching process. For example, a first wet etch process may be used to remove the dummy poly gate, and s second wet etch process may be used to remove the dummy dielectric. The second wet etch process may include exposure to a buffered HF solution or a buffered oxide etchant (BOE). It is understood that other etching chemicals may be used for selectively removing the dummy poly gates and/or dummy dielectrics. Next, a high k gate film and a metal gate layer is formed to substantially fill in the trenches in the circuit region. The high k layers may include an interfacial layer, a high-k dielectric layer, and/or a barrier layer. Additionally, a fill metal is deposited to fill in the trenches. In an embodiment, a layer of titanium (Ti) may be deposited to function as a wetting layer for a subsequent aluminum (Al) fill. The Ti layer may be formed by PVD or other suitable process. A layer of metal, such as Al, may be formed to fill in the trenches. The Al layer may be formed by forming a first Al layer by CVD and then forming a second Al layer by PVD. Alternatively, the fill metal may optionally include tungsten (W), copper (Cu), or other suitable metal material. Subsequently, a CMP process may be performed on the metal gate structures in the circuit region to remove the excess metal, and the CMP may have a high selectivity to provide a substantially planar surface for the gate structure, including removing the PR layer in the seal ring region.

Seal ring structure 210 may be comprised of various stacked conductive layers 212 and via layers 214 disposed through dielectric layers 216, and may have a width between about 5 microns and about 15 microns in one example.

It is understood that the semiconductor device 200 may undergo further processing in the circuit region to form various features such as contacts/vias, interconnect metal layers, interlayer dielectric, passivation layers, etc. to form semiconductor circuits as is known in the art.

Referring now to FIG. 4 in conjunction with FIG. 2, an embodiment of the seal ring structure 210 is electrically coupled to a corner bump 224 by a connector 222 according to various aspects of the present disclosure. Connector 222 may be electrically coupled to a metal layer (e.g., a top metal layer) of the seal ring structure 210 at a first end of the connector 222 and to corner bump 224 (directly or via a base 225) at a second end of the connector 222. In one aspect, connector 222 may be electrically coupled to a corner stress relief portion of seal ring structure 210. In another aspect, connector 222 may be comprised of a conductive material and a single layer, or connector 222 may be comprised of various conductive materials and/or a plurality of conductive layers. In one example, connector 222 may be comprised of silver, lead, tin, copper, other metal, or alloys thereof. Corner bump 224 may be comprised of silver solder, lead tin, copper, or other material. Corner bump 224 may also be comprised of various cross-sectional shapes, such as a circle, octagon, or a hexagon, in one example. Corner bump 224 is used to electrically connect to a signal ground 402 to thereby ground seal ring structure 210. Corner bump 224 is not otherwise actively used in the circuit except to connect to the signal ground.

Referring now to FIGS. 5A-5C, FIGS. 5A and 5B illustrate top plan views of different triangular corner bump zones 532 of an IC chip according to various aspects of the present disclosure, and FIG. 5C illustrates an embodiment of a corner bump 524 within a triangular corner bump zone 532 according to an aspect of the present disclosure. An IC chip may have four more triangular corner bump zones 532 in one example. In FIG. 5A, a triangular corner bump zone 532a includes a single corner bump 524 disposed in an IC region 502a surrounded by seal ring region 201 and assembly isolation region 204. In this embodiment, triangular corner bump zone 532a is an isosceles triangle having the same or common leg of length 1.7C, where C is the diameter of the corner bump 524 (see FIG. 5C). In FIG. 5B, a triangular corner bump zone 532b includes three corner bumps 524 disposed in an IC region 502b surrounded by seal ring region 201 and assembly isolation region 204. In this embodiment, triangular corner bump zone 532b is an isosceles triangle having the common leg of length (1.7C+P), where C is the diameter of the corner bump 524 and P is the pitch distance between the centers of adjacent corner bumps 524. Dependent upon the area of an entire IC region, more or less corner bumps may be included within a corner bump zone to be electrically coupled to the seal ring structure and to be electrically coupled to a ground. No active bump will be included within the corner bump zone 532, or in other words, active bumps are excluded from the corner bump zone 532.

In one aspect, Table 1 below includes an example of a minimum corner bump count within a triangular corner bump zone to be electrically coupled to the seal ring structure for grounding the seal ring structure, based on the area of the entire IC region. As noted above, C is the diameter of the corner bump, and P is the pitch distance between the centers of adjacent corner bumps.

TABLE 1

| Chip Size (mm$^2$) | Area $\leq$ 100 | 100 $\leq$ Area $\leq$ 225 | Area > 225 |
|---|---|---|---|
| Leg Dimension of Corner Bump Zone | 1.7 * C | 1.7 * C~1.7 * C + P | >1.7 * C + P |
| Minimum Dummy Bump Count | 1 | 1~3 | >/=3 |

Referring to the example provided in Table 1, for an entire IC region area below or equal to about 100 mm$^2$, the common leg of the triangular corner bump zone may have a length of 1.7C and a single corner bump to be electrically coupled to the seal ring structure and a ground. For an entire IC region area between about 100 mm$^2$ and about 225 mm$^2$, the common leg of the triangular corner bump zone may have a length of 1.7C to 1.7C+P and a single corner bump to 3 corner bumps to be electrically coupled to the seal ring structure and a ground. For an entire IC region area greater than about 225 mm$^2$, the common leg of the triangular corner bump zone may have at least a length of 1.7C+P and more than three corner bumps to be electrically coupled to the seal ring structure and a ground.

The present disclosure provides for many different embodiments. One of the broader forms of the present disclosure involves a semiconductor device. The semiconductor device includes a substrate having a seal ring region and a circuit region, at least one corner bump disposed in the circuit region, a seal ring structure disposed in the seal ring region, and a connector electrically coupling a metal layer of the seal ring structure to the at least one corner bump. The at least one corner bump is configured to be coupled to a signal ground.

Another of the broader forms of the present disclosure involves a semiconductor device including a substrate having a seal ring region and a circuit region, a plurality of corner bumps disposed in a triangular corner bump zone at each corner of the circuit region, a seal ring structure disposed in the seal ring region, and each connector of a plurality of connectors electrically coupling a metal layer of the seal ring structure to a respective corner bump of the plurality of corner bumps, each of the plurality of corner bumps configured to be coupled to a signal ground.

Another of the broader forms of the present disclosure involves a method of fabricating a semiconductor device. The method includes providing a substrate having a seal ring region and a circuit region, providing at least one corner bump in a triangular corner bump zone in the circuit region, providing a seal ring structure in the seal ring region, electrically coupling a metal layer of the seal ring structure to the at least one corner bump, and electrically coupling the at least one corner bump to a signal ground.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a substrate having a seal ring region and a circuit region;
    at least one corner bump disposed in the circuit region;
    a seal ring structure disposed in the seal ring region; and
    a connector electrically coupling a metal layer of the seal ring structure to the at least one corner bump, the at least one corner bump configured to be coupled to a signal ground.

2. The semiconductor device of claim 1, wherein the at least one corner bump is comprised of silver, lead, tin, copper, or combinations thereof.

3. The semiconductor device of claim 1, wherein the seal ring structure is comprised of a stack of metal layers disposed around the circuit region.

4. The semiconductor device of claim 1, wherein the at least one corner bump is disposed within a triangular corner bump zone of the circuit region, the triangular corner bump zone having the same leg of length 1.7C, where C is the diameter of the at least one corner bump.

5. The semiconductor device of claim 1, wherein the at least one corner bump is disposed within a triangular corner bump zone of the circuit region, the triangular corner bump zone having the same leg of length from substantially 1.7C to 1.7C+P, where C is a diameter of the at least one corner bump and P is a pitch distance between the centers of adjacent corner bumps.

6. The semiconductor device of claim 1, further comprising a plurality of corner bumps disposed in the circuit region, wherein each corner bump of the plurality of corner bumps is electrically coupled to the metal layer of the seal ring structure.

7. The semiconductor device of claim 1, wherein three corner bumps are disposed within a triangular corner bump zone of the circuit region, the triangular corner bump zone having the same leg of length 1.7C+P, where C is a diameter of the at least one corner bump and P is a pitch distance between the centers of adjacent corner bumps.

8. The semiconductor device of claim 1, wherein three corner bumps are each electrically coupled to the metal layer of the seal ring structure, and wherein an area of the circuit region is greater than about 225 $mm^2$.

9. The semiconductor device of claim 1, wherein the connector is comprised of at least one metal layer.

10. A semiconductor device, comprising:
    a substrate having a seal ring region and a circuit region;
    a plurality of corner bumps disposed in a triangular corner bump zone at each corner of the circuit region;
    a seal ring structure disposed in the seal ring region; and
    each connector of a plurality of connectors electrically coupling a metal layer of the seal ring structure to a respective corner bump of the plurality of corner bumps, each of the plurality of corner bumps configured to be coupled to a signal ground.

11. The semiconductor device of claim 10, wherein the seal ring structure is comprised of a stack of metal layers disposed around the circuit region.

12. The semiconductor device of claim 10, wherein an area of the circuit region is between about 100 $mm^2$ and about 225 $mm^2$, and at least one corner bump per triangular corner bump zone is electrically coupled to the metal layer of the seal ring structure.

13. The semiconductor device of claim 10, wherein an area of the circuit region is greater than about 225 $mm^2$, and three corner bumps per triangular corner bump zone are each electrically coupled to the metal layer of the seal ring structure.

14. A method of fabricating a semiconductor device, the method comprising:
    providing a substrate having a seal ring region and a circuit region;
    providing at least one corner bump in a triangular corner bump zone in the circuit region;
    providing a seal ring structure in the seal ring region;
    electrically coupling a metal layer of the seal ring structure to the at least one corner bump; and
    electrically coupling the at least one corner bump to a signal ground.

15. The method of claim 14, further comprising electrically coupling the metal layer of the seal ring structure to a single corner bump in the triangular corner bump zone, wherein an area of the circuit region is less than or equal to about 100 $mm^2$.

16. The method of claim 14, further comprising electrically coupling the metal layer of the seal ring structure to at least one corner bump in the triangular corner bump zone when an area of the circuit region is between about 100 $mm^2$ and about 225 $mm^2$.

17. The method of claim 14, wherein three corner bump are disposed within the triangular corner bump zone, the triangular corner bump zone having the same leg of length 1.7C+P, where C is a diameter of the at least one corner bump and P is a pitch distance between the centers of adjacent corner bumps.

18. The method of claim 14, wherein the triangular corner bump zone has the same leg of length from substantially 1.7C to 1.7C+P, where C is a diameter of the at least one corner bump and P is a pitch distance between the centers of adjacent corner bumps.

19. The method of claim 14, further comprising electrically coupling the metal layer of the seal ring structure to three corner bumps in the triangular corner bump zone, wherein an area of the circuit region is greater than about 225 $mm^2$.

* * * * *